United States Patent [19]

Okubo et al.

[11] 4,336,597

[45] Jun. 22, 1982

[54] METHOD AND SYSTEM FOR MEASURING THE DIAMETER OF AN ELECTRON BEAM

[75] Inventors: Tsuneo Okubo, Hachioji; Yasuo Kato, Zama; Genya Matsuoka, Tokyo, all of Japan

[73] Assignees: Nippon Telegraph and Telephone Public Corp.; Hitachi, Ltd., both of Tokyo, Japan

[21] Appl. No.: 163,295

[22] Filed: Jun. 26, 1980

[30] Foreign Application Priority Data

Jul. 23, 1979 [JP] Japan .................................. 54-92677

[51] Int. Cl.³ ............................................. G01N 23/00
[52] U.S. Cl. .................................... 364/560; 364/563; 250/397
[58] Field of Search ............................... 364/560, 563; 324/71 EB; 235/92 DN; 358/101, 107; 356/121, 122; 250/397, 307, 310, 311; 219/121 EB, 121 ER, 121 ES

[56] References Cited

U.S. PATENT DOCUMENTS

| 3,909,612 | 9/1975 | Gibbard | 250/310 |
| 3,949,228 | 4/1976 | Ryan | 219/121 ER |
| 4,004,149 | 1/1977 | Sato et al. | 250/397 |
| 4,086,491 | 4/1978 | Vaughan | 250/397 |
| 4,199,689 | 4/1980 | Takigawa | 219/121 EB |
| 4,233,515 | 11/1980 | Dietrich et al. | 250/397 |

Primary Examiner—Errol A. Krass
Assistant Examiner—Gary Chin
Attorney, Agent, or Firm—Craig and Antonelli

[57] ABSTRACT

A method of measuring the diameter of an electron beam in which the electron beam diameter is measured from the leading edge or trailing edge of a detector signal that is obtained as the mark area formed on the specimen is scanned by the electron beam. This method comprises the following steps: scanning the specimen by the electron beam at least once to find the maximum and minimum values of the detector signal; setting two threshold levels based on the maximum and minimum values; scanning the mark area by the electron beam to measure the time interval during which the level of the detector signal is within the two threshold levels; and calculating the beam diameter.

9 Claims, 7 Drawing Figures

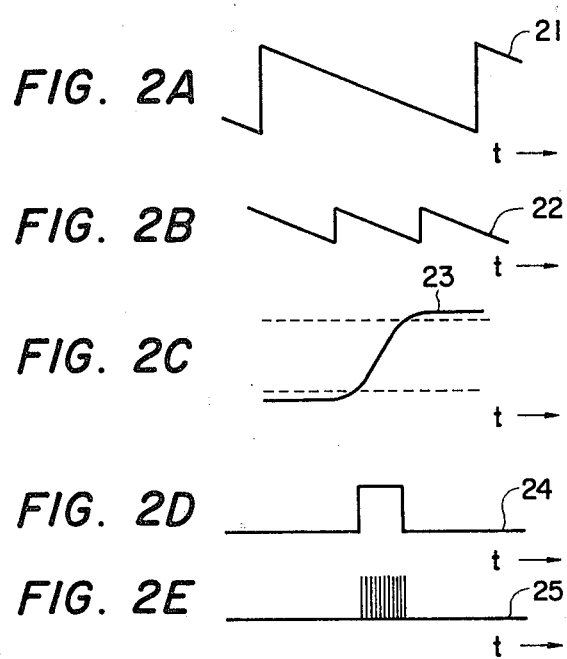

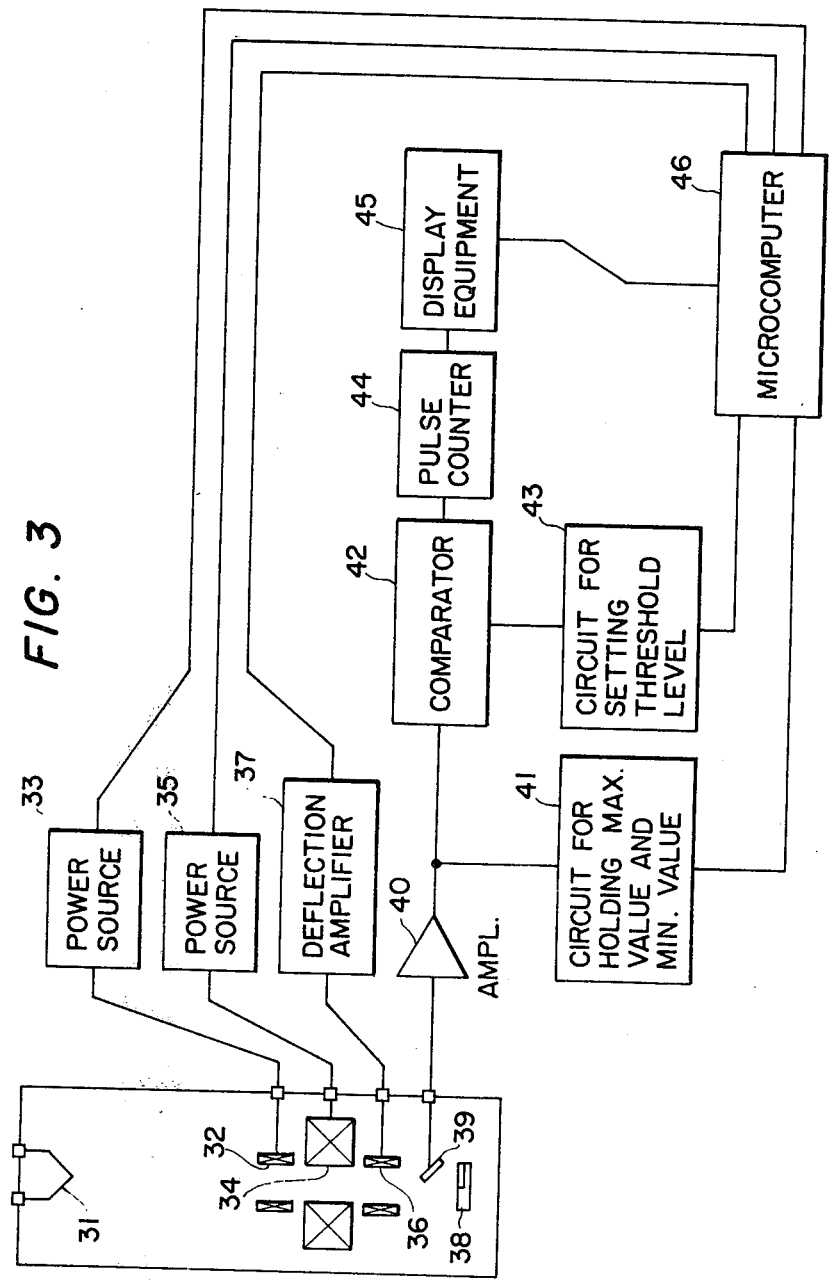

METHOD AND SYSTEM FOR MEASURING THE DIAMETER OF AN ELECTRON BEAM

BACKGROUND OF THE INVENTION

This invention relates to a method and system for measuring the diameter and shape of an electron beam used in such electron beam devices as an apparatus for electron beam lithography.

The adjustment in the electron beam devices to keep the diameter minimum or the shape of the spot of the beam on the specimen circular is called a focus adjustment or astigmatism correction, respectively. In conventional methods of adjustment, an operator watches a cathode ray tube to measure the rise time of a detector signal which is obtained by having the electron beam sweep across a mark on the specimen at a boundary between two areas with different characteristics.

In scanning type electron microscopes, these adjustments may be performed directly by observing an image and adjusting it on the basis of the observer's visual sense. The conventional methods, however, have disadvantages in that the adjustment takes time and the accuracy thereof varies depending on the individual who works on the device, because the adjustment depends on the operator's judgment.

SUMMARY OF THE INVENTION

This invention has been accomplished to overcome the abovementioned drawbacks.

An object of this invention is to provide a method and a system for measuring the diameter of an electron beam, which will enable an automatic, accurate, quick, uniform adjustment by electronically measuring the diameter of the electron beam.

To achieve this objective, the method of this invention comprises the steps of: finding the maximum and minimum values of a detector signal by making the electron beam sweep at least once across a marking formed on the specimen which occupies a boundary between materials of different characteristic; setting at least two threshold levels which are determined from the maximum and minimum values; causing the electron beam to scan the marking on the specimen, tracing the same scanning path that was traced by the first scanning; measuring the time during which the level of the detector signal is between the two threshold levels; and calculating the diameter of the electron beam based on the measured time. The invention also provides a system for performing this method.

BRIEF DESCRIPTION OF THE DRAWINGS

FIGS. 2A to 2E are waveforms obtained at respective components of this system; and FIG. 3 is a schematic block diagram showing another embodiment of this invention.

DETAILED DESCRIPTION OF THE PREFERRED EMBODIMENTS

Figure 1:
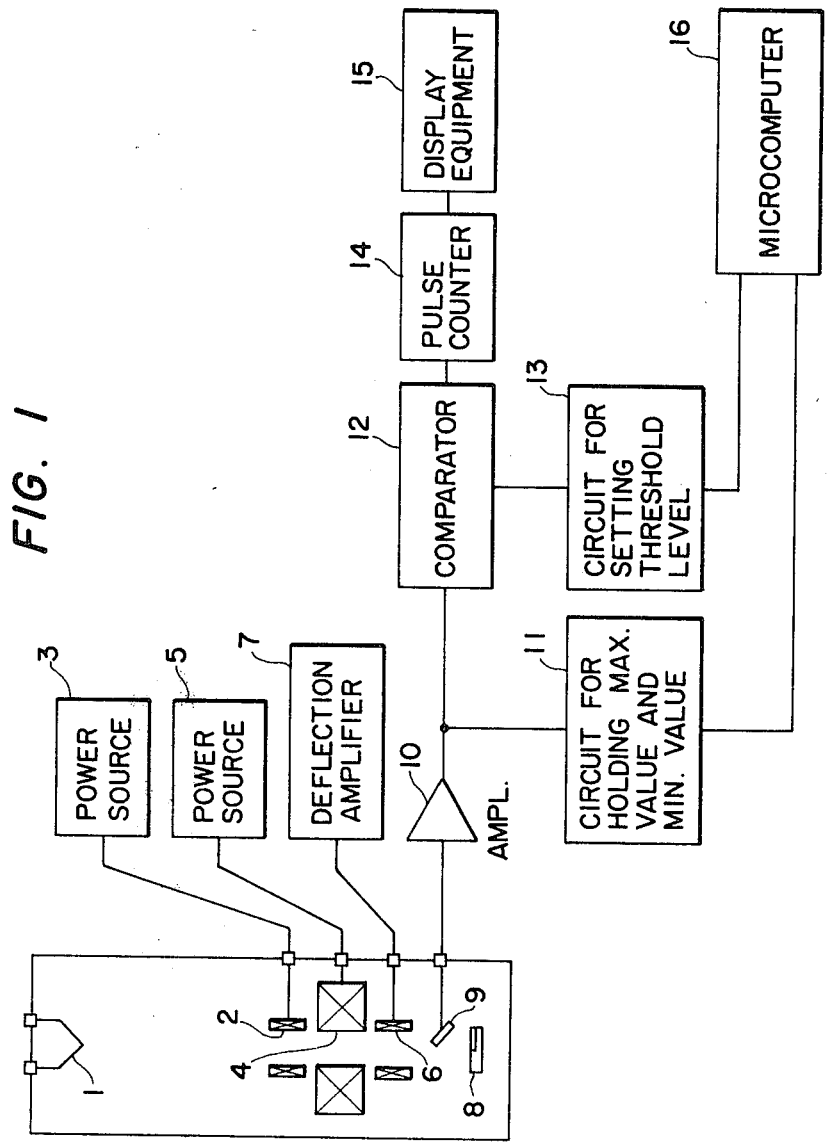
FIG. 1 is a schematic block diagram representing an embodiment of this invention.

This invention will now be described in conjunction with preferred embodiments.

FIG. 1 is a block diagram showing a first embodiment of this invention. FIGS. 2A through 2E show waveforms obtained at respective components of this system.

In FIG. 1 an electron beam is emitted from the electron gun 1 and the diameter and shape of the beam spot on the specimen 8 are controlled by an astigmatism correction coil 2 energized by a power source 3 and an objective lens 4 powered by a power source 5. A current with a waveform 21 as shown in FIG. 2A is supplied from a deflection amplifier 7 to a deflection coil 6 to cause the electron beam to sweep across the specimen 8.

The specimen 8 has a marking at a boundary between two areas having different material quality or characteristics, such as the reflection coefficient, the coefficient for secondary electron emission or the transmission coefficient. As the electron beam crosses the boundary, a detector 9 for detecting the reflected electrons, secondary electrons and transmitted electrons generates a signal whose waveform 23 is as shown in FIG. 2C. From the rise time of this waveform, the diameter of the beam as measured in the direction of scan is obtained. The output of the detector 9 is amplified by the amplifier 10.

The detection system of this invention has a circuit 11 for detecting and holding maximum and minimum values and a circuit 13 for setting threshold levels. As the electron beam scans the specimen crossing the boundary, the maximum and minimum values of the detector signal are detected and stored by the circuit 11, which may be formed by standard peak detector circuits and an analog/digital converter to provide these peak values in digital form for the microcomputer 16. A microcomputer 16 reads the values stored in the circuit 11 to determine upper and lower threshold levels that are then sent to the circuit 13, which will include a digital/analog converter to provide the threshold levels in analog form. The upper threshold level may, for example, be set at 90 percent of the amplitude between the maximum and minimum values, and the lower threshold level at 10 percent of the amplitude, as represented by the horizontal broken lines crossing the waveform 23 in FIG. 2C.

This invention, however, is not limited to these values, and where very large noise exists in the detected signal, it is desirable that the two threshold levels be set closer to the central value, i.e., ½ (maximum value + minimum value). For example, the upper and lower threshold levels may be 75% and 25% of the amplitude of the signal.

In this way, the electron beam is made to sweep across the specimen at least once to find the maximum and minimum values of the detector signal from which at least two kinds of threshold levels are determined.

With the threshold levels set, the system starts measuring the diameter of the electron beam. The electron beam is again made to scan the specimen, tracing the same scanning path as was previously traced, and a comparator 12 detects the time during which the value of the output of the detector 9 is between the two set threshold levels and at the same time generates a gate signal having the waveform 24 as shown in FIG. 2D. A pulse counter 14 counts clocked pulses 25, as shown in FIG. 2E, while the gate signal 24 is high and the count value is displayed on display equipment 15. The frequency of the clocked pulses is determined such that this count value gives the diameter of the electron beam. FIG. 2B shows the waveform 22 of the output current of the deflection amplifier 7 which enables the electron beam to scan the specimen over the short range containing the boundary and thereby reduces the time required for detecting the rise time.

To summarize the process so far, the electron beam scans the specimen over the relatively-long path at least once to detect the maximum and minimum values of the detector signal to set at least two kinds of threshold level; and then the electron beam is made to scan over the relatively-short path crossing the boundary, an essential portion of the specimen for the measurement of the beam diameter, so as to reduce the time for measurement.

The focus adjustment or astigmatism correction can be made by manually adjusting the potentiometers for power sources 3 and 5 while reading the beam diameter which is automatically measured.

FIG. 3 is a block diagram showing another embodiment of this invention which enables automatic control of the electron beam. Blocks with reference numerals 31-46 in FIG. 3 correspond to those denoted by reference numerals 1-16 in FIG. 1 and the corresponding blocks have substantially the same function. In the system of FIG. 3, the outputs from the power source 33 for the astigmatism correction coil 32 and 35 for the objective lens 34 can be controlled by the microcomputer 46. That is, the microcomputer 46 controls the signal supplied from the deflection amplifier 37 to the deflection coil 36. The measured beam diameter is read from the display equipment 45 by the microcomputer 46. With this construction it is possible to perform automatic focus adjustments and astigmatism corrections on the electrom beam.

In making the automatic focus adjustment, the microcomputer 46 specifies the output of the power source 35 for the objective lens and at the same time issues a command to the deflection amplifier 37 in order to cause the electron beam to sweep across the boundary on the specimen 38 bordering the areas having different coefficients. The diameter of the electron beam is measured in accordance with the process already mentioned. After reading and storing the measured value of the electron beam diameter, the microcomputer 46 changes the output of the power source 35 for driving the objective lens 34 and issues a command to the deflection amplifier 37 to cause the electron beam to scan the specimen once again. With the scan completed, the microcomputer 46 reads the measured value of the beam diameter from the display equipment 45 and stores it in the memory. The first and second measured values are compared by the microcomputer which then sets the output of the power source 35 so as to reduce the beam diameter. By repeating this process it is possible to automatically determine the optimum excitation condition of the objective lens that will set the beam diameter to the smallest possible value. In this way the automatic focus adjustment is performed.

For the automatic astigmatism correction, the electron beam is made to scan the specimen in two mutually-perpendicular directions and the power source 33 for the astigmatism correction coil 32 is controlled to obtain the optimum excitation condition under which the beam diameters as measured in the two directions are equal.

As can be seen in the foregoing, this invention makes it possible to automatically measure the diameter of the electron beam with high accuracy and in a short time whether changes occur in the intensity of the electron beam and in the gain and zero point of the detector and amplifier.

What is claimed is:

1. A method of measuring an electron beam diameter comprising the steps of: scanning at least once a mark area formed on a specimen by an electron beam; detecting electrons received from said specimen as a result of said scanning to produce a detector signal; detecting the maximum and minimum values of said detector signal; setting at least two threshold levels which are determined from said maximum and minimum values, respectively; causing the electron beam to scan the mark area tracing the same scanning path that was previously scanned; again detecting electrons emitted from said specimen; measuring the time during which the level of the detector signal that is obtained by the second scanning is between the two threshold levels; and calculating the diameter of the electron beam based on the measured time.

2. A method of measuring an electron beam diameter as set forth in claim 1, wherein the mark area is formed on a boundary between two areas having different material characteristics.

3. A method of measuring an electron beam diameter as set forth in claim 1 or 2, wherein the detector signal obtained when the electron beam scans the mark area formed on the specimen is produced by detection of reflected electrons.

4. A method of measuring an electron beam diameter as set forth in claim 1 or 2, wherein the detector signal obtained when the electron beam scans the mark area formed on the specimen is produced by detection of electrons that have been transmitted through the specimen.

5. A method of measuring an electron beam diameter as set forth in claim 1 or 2, wherein the detector signal obtained when the electron beam scans the mark area formed on the specimen is produced by detection of secondary electrons that are emitted from the specimen.

6. A system for measuring an electron beam diameter comprising: first means for scanning a mark area formed on a specimen by means of the electron beam whose diameter is to be measured; second means for detecting the maximum and minimum values of a detector signal produced by detecting electrons emitted from the specimen as a result of the scanning action by said first means; third means for setting two threshold levels on the basis of the maximum and the minimum values of the detector signal; fourth means responsive to said second and third means for measuring the time during which the level of the detector signal is between said two threshold levels as the electron beam is made to scan the mark area tracing the same scanning path as was previously traced by the first scan; and fifth means responsive to said fourth means for calculating the diameter of the electron beam from the measured time.

7. A system for measuring an electron beam diameter as defined in claim 6, wherein said fifth means includes control means for generating control signals to control the diameter of said beam on the basis of said measurement of time.

8. A system for measuring an electron beam diameter, comprising means for scanning the beam successively over a mark area formed on a boundary between areas having different material characteristics on a specimen; first detecting means for detecting electrons received from said specimen as a result of said scanning and for producing a detector signal; second detecting means for detecting the maximum and minimum values of said detector signal; means for storing first and second threshold signals representing said maximum and minimum values, respectively, as received from said second detecting means; means for measuring the time during which the level of the detector signal is between the levels of said first and second threshold signals; and means for calculating the diameter of said electron beam on the basis of said measured time.

9. A system as defined in claim 8, further including focusing means for controlling the diameter of said beam, said calculating means including control means for controlling said focusing means to regulate the diameter of said beam.

* * * * *